(12) United States Patent
Kondo (10) Patent No.: US 8,247,948 B2
(45) Date of Patent: Aug. 21, 2012

(54) OSCILLATOR, OSCILLATOR ARRAY AND AN ELECTRONIC APPARATUS

(75) Inventor: Takayuki Kondo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 295 days.

(21) Appl. No.: 12/769,091

(22) Filed: Apr. 28, 2010

(65) Prior Publication Data

US 2010/0277251 A1 Nov. 4, 2010

(30) Foreign Application Priority Data

May 1, 2009 (JP) ................................. 2009-112011

(51) Int. Cl.
*H01L 41/053* (2006.01)

(52) U.S. Cl. ........ 310/333; 310/317; 310/340; 310/348; 310/361

(58) Field of Classification Search ............. 310/316.03, 310/317, 333, 340, 348, 361
See application file for complete search history.

(56) References Cited

U.S. PATENT DOCUMENTS

| | | | | |
|---|---|---|---|---|
| 4,523,120 A | * | 6/1985 | Assard et al. ............ | 310/323.17 |
| 5,185,550 A | * | 2/1993 | Morita et al. ................. | 310/344 |
| 5,447,869 A | | 9/1995 | Okahata | |
| 5,894,651 A | * | 4/1999 | Dvorsky et al. ............... | 310/344 |
| 6,586,860 B1 | * | 7/2003 | Iino et al. ................. | 310/316.02 |
| 7,659,654 B2 | | 2/2010 | Kondo | |
| 7,944,131 B2 | * | 5/2011 | Kawashima .................. | 310/370 |
| 2008/0229829 A1 | * | 9/2008 | Kondo ............................ | 73/579 |
| 2008/0303383 A1 | * | 12/2008 | Orcutt et al. .................. | 310/333 |
| 2010/0002060 A1 | * | 1/2010 | Uraki ............................... | 347/69 |
| 2010/0277251 A1 | * | 11/2010 | Kondo .......................... | 331/158 |
| 2011/0050352 A1 | * | 3/2011 | Kondo et al. .................... | 331/46 |

FOREIGN PATENT DOCUMENTS

| | | |
|---|---|---|
| JP | A-63-222248 | 9/1988 |
| JP | A-03-282232 | 12/1991 |
| JP | A-5-187986 | 7/1993 |
| JP | A-06-104641 | 4/1994 |
| JP | A-07-027731 | 1/1995 |
| JP | B2-8-12141 | 2/1996 |
| JP | A-11-041059 | 2/1999 |
| JP | A-2000-013141 | 1/2000 |
| JP | A-2001-308666 | 11/2001 |
| JP | A-2004-361269 | 12/2004 |
| JP | A-2007-271449 | 10/2007 |
| JP | A-2008-236460 | 10/2008 |
| JP | A-2009-222669 | 10/2009 |
| JP | 2010-263365 A | * 11/2010 |
| JP | 2011-117972 A | * 6/2011 |

* cited by examiner

*Primary Examiner* — Thomas Dougherty
(74) *Attorney, Agent, or Firm* — Oliff & Berridge, PLC (57) ABSTRACT

A oscillator include: a vibrator that vibrates in a thickness shear vibration mode; a first adsorption film formed in a first region in a first surface of the vibrator; a second adsorption film formed in a second region in a second surface of the vibrator opposing to the first surface; and a substrate with a surface on which the vibrator is erected, wherein the vibrator contacts the substrate in a third surface that is different from the first surface and the second surface.

11 Claims, 5 Drawing Sheets

OSCILLATOR, OSCILLATOR ARRAY AND AN ELECTRONIC APPARATUS

The entire disclosure of Japanese Patent Application No. 2009-112011, filed May 1, 2009 is expressly incorporated by reference herein.

BACKGROUND

1. Technical Field

The present invention relates to oscillators and oscillator arrays.

2. Related Art

When certain molecules adhere to the surface of a crystal oscillator that is in a resonance state, the resonance frequency changes according to the adsorption amount (weight). A technology using such a phenomenon is called QCM (Quarts Crystal Microbalance), and used in sensors for detecting the presence or the amount of molecules.

Generally, AT-cut crystal vibrators are used for QCM. The AT-cut crystal vibrator refers to a cut crystal substrate in a specific crystal orientation with respect to the quartz crystal axis, and is widely used without being limited to QCM because changes in its temperature coefficient adjacent to room temperature are extremely small and it has excellent temperature stability.

An AT-cut crystal vibrator is made of a crystal plate having excitation electrodes formed on front and back surfaces thereof and operates in a so-called thickness shear vibration mode in which the front surface and the back surface move in opposite directions upon application of a voltage between the electrodes. Its resonance frequency $f_0$ is in reverse proportion to the thickness of the crystal plate at a portion between the front and back electrodes, and generally has the following relation.

$$f_0(\text{MHz}) = 1670/\text{the thickness of crystal plate (μm)}$$

It is known that the relation between changes in the oscillation frequency $\Delta f$ of a crystal vibrator in the QCM using such an AT-cut crystal vibrator and the mass $\Delta M$ adsorbed on the crystal vibrator is expressed by the following Sauerbrey equation.

$$\Delta f = -\frac{2 \times f_0^2}{\sqrt{\rho \times \mu}} \times \frac{\Delta M}{A} \quad \text{[Equation 1]}$$

Where $f_0$ is a resonant frequency of the crystal vibrator, $\rho$ is the density of quartz, $\mu$ is the shear modulus of quartz, and $A$ is an effective vibration area (i.e., generally equal to the electrode area).

QCM can be used in a variety of applications. By forming an adsorption film on an oscillator which selectively adsorbs specified molecules such as odor molecules, QCM can be used for odor sensors that detect specified odor.

For example, Japanese Laid-open Patent Application SHO 63-222248 (Patent Document 1) describes a technology that uses an element having a crystal oscillator with electrodes and adsorption films formed thereon (FIG. 6 in Patent Document 1) for detecting the presence of odor substance saturated in the air atmosphere by means of a change in the frequency. Also, Japanese Examined Patent Application Publication HEI 08-012141 (Patent Document 2) and Japanese Laid-open Patent Application HEI 05-187986 (Patent Document 3) describe technologies for specifying the kinds of odors by using a plurality of crystal oscillators.

As the thickness of crystal oscillators is reduced, their mechanical strength becomes weaker, which makes manufacturing and handling thereof more difficult. In this respect, a technology that uses a crystal oscillator in a so-called inverted mesa structure has been developed, in which a recess is formed in one of the surfaces of the crystal oscillator thereby thinning a portion of the crystal oscillator. Such a technology is described in, for example, Japanese Laid-open Patent Application 2001-308666 (Patent Document 4).

There are cases where the mass of adsorbed substance $\Delta M$ is extremely small. In such cases, even when adsorbing substance is adsorbed on the adsorption film, the change in the frequency is very small, so that detection of the substance is not readily made.

SUMMARY

In accordance with an embodiment of the invention, an oscillator with higher detection sensitivity can be provided.

In accordance with an embodiment of the invention, an oscillator includes a vibrator that vibrates in a thickness shear vibration mode, a first adsorption film formed in a first region in a first surface of the vibrator, a second adsorption film formed in a second region in a second surface of the vibrator opposing the first surface, and a substrate with a surface on which the vibrator is erected, wherein the vibrator contacts the substrate in a third surface that is different from the first surface and the second surface.

According to this structure, the vibrator is erected on the substrate, whereby target substance would more readily contact the adsorption films formed on the both surfaces of the vibrator, such that the mass of substance $\Delta M$ being adsorbed can be made greater. By this, the detection sensitivity of target substance by the vibrator can be increased.

Also, the vibrator may be erected and fixed to the substrate in a manner that only one side of the side surface thereof is in contact with the substrate, whereby changes in the oscillation frequency due to influence by stress caused by warping of the substrate that may affect the vibrator can be suppressed to the minimum.

Further, the vibrator may preferably be equipped with a first electrode formed in the first region between the vibrator and the first adsorption film and a second electrode formed in the second region between the vibrator and the second adsorption film.

According to this structure, the electrodes are provided between the vibrator and the adsorption films in the regions where the adsorption films are formed, such that the vibrator can be uniformly vibrated. It is noted that the first and second regions in the vibrator may include central portions of the first and second surfaces, respectively, which is preferred as the vibrator can be more uniformly vibrated.

Further, the vibrator may preferably be equipped with a first electrode formed in the first surface in a third region that contacts the substrate and does not overlap the first region and a second electrode formed in the second surface in a fourth region that contacts the substrate and does not overlap the second region.

Also, the vibrator may be further equipped with an integrated circuit including an oscillation circuit mounted on the back surface of the substrate, wherein the first electrode and the second electrode may preferably be connected to the integrated circuit respectively through a wiring passing through the substrate.

According to this structure, the wiring between the vibrator and the oscillation circuit can be made shorter, and it is possible to reduce noise entering in the wiring.

Also, the vibrator may preferably be fitted in a groove provided in the substrate. According to this structure, the mounting strength of the vibrator that is erected and mounted on the substrate can be enhanced. By this, the danger of the vibrator being separated from the substrate or the vibrator being destroyed can be reduced even upon application of vibration or impact thereto.

Also, the vibrator may preferably be erected on a sloped surface provided in the substrate. According to this structure, the vibrator can be erected with a tilt angle with respect to the substrate. Also, the sloped surface may be formed without forming a groove in the substrate. Therefore, the substrate with a greater mounting strength of the vibrator and the vibrator including the substrate can be manufactured more easily than in the case of forming grooves.

Furthermore, the vibrator may preferably have an inverted mesa structure having a recess in one of the surfaces.

Moreover, in accordance with an embodiment of the invention, an oscillator array is equipped with a plurality of any of the vibrators described above. According to the oscillator array having such a structure, the oscillator array can be formed with the character of at least any one of the vibrators described above. Therefore it is possible to provide an oscillator array having an improved higher detection sensitivity of target substance by the vibrator.

Also, the plurality of vibrators in the oscillator array may preferably be arranged to extend on the substrate such that manners of alignments of the vibrators in a first direction exist in plurality with respect to a second direction perpendicular to the first direction, and normal directions to the vibrators in adjacent ones of the rows are set in different orientations.

According to this structure, the plural vibrators arranged in a matrix configuration in a plan view are oriented in mutually different directions, such that turbulence can be generated in the target substance that flows through the vibrators, and the target substance would more likely be in contact with the adsorption films formed on the vibrators. By this, the detection sensitivity of the vibrators can be further increased.

In accordance with an embodiment of the invention, an electronic apparatus is equipped with any one of the oscillators or the oscillator array. The electronic apparatus having such a structure has the character of each of the embodiments described above, such that, for example, the detection sensitivity of the vibrator can be increased.

It is noted that, in the invention, the "oscillator" includes a vibrator and a substrate. Also, in the present specification, the "electronic apparatus" includes any and all apparatuses equipped with any one of the oscillators or the oscillator array described in the present specification. Also, any "○○ circuit (○○ may be any arbitrary words)" appearing in the present specification not only include an electrical circuit, but may also include a physical mean that achieves the function of the circuit or a functional mean that is realized by software. Also, the function of one section may be realized by two or more physical means or functional means, or the function of two or more sections may be realized by one physical mean or one functional mean.

DESCRIPTION OF EXEMPLARY EMBODIMENTS

Concrete embodiments of the invention will be described, according to the following composition, with reference to the accompanying drawings. It should be understood, however, that the following embodiments are merely examples of the invention, and do not limit the technical range of the invention. It is noted that identical parts in the drawings will be appended with the same reference numbers.

1. Example of Structure of Sensor System including Oscillator Array
2. Example of Structure of Oscillation Circuit connected to Vibrator
3. Example of Structure of Vibrators
4. Connection Example of Vibrators and Substrate
 (1) Embodiment 1
 (2) Embodiment 2
 (3) Embodiment 3
5. Example of Placement of Vibrators
 (1) Embodiment 4
 (2) Embodiment 5
 (3) Embodiment 6
6. Conclusion 1. Example of Structure of Sensor System Including Oscillator Array The invention relates to oscillators and oscillator arrays, and the oscillators and oscillator arrays in accordance with the invention may be used as parts of sensor systems or the like included in electronic apparatuses. The sensor systems include odor sensors, alcohol sensors and the like. The structure of a sensor system will be briefly described below using an example of a sensor system for detecting odor of target substance.

Figure 1:
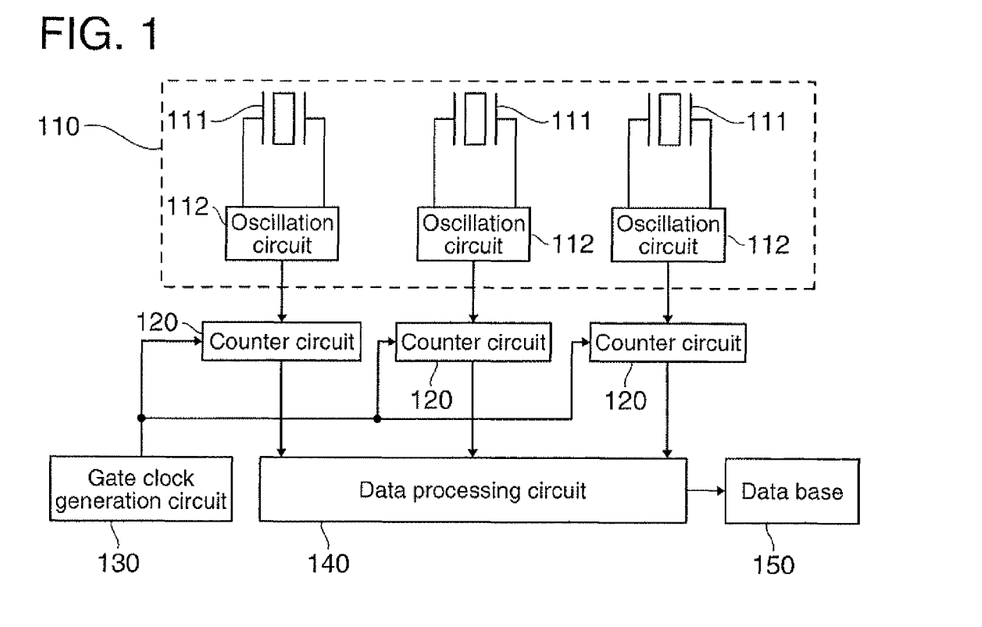
FIG. 1 is a diagram showing an example of a sensor system that includes an oscillator array.

FIG. 1 is a diagram showing an example of a sensor system that includes an oscillator array in accordance with an embodiment of the invention.

Outline of Structure of Sensor System

As shown in FIG. 1, the sensor system in accordance with the present embodiment includes an oscillator array 110 equipped with plural sets of crystal vibrator 111 and oscillation circuit 112, a counter circuit 120, a gate clock generation circuit 130, a data processing circuit 140 and a database 150. It is noted that the oscillator array 110 needs to include at least a plurality of crystal vibrators 111, and may not necessarily include the oscillation circuits 112.

Crystal Vibrators 111

Each of the crystal vibrators 111 has a pair of excitation electrodes on a front surface and a back surface thereof, and the pair of excitation electrodes is connected to the oscillation circuit 112.

Also, the excitation electrodes of the crystal vibrator 111 are equipped on their surfaces with adsorption films having a characteristic that selectively adsorbs specific substance, and are exposed to an ambient gas (or liquid or other medium) that is a target substance for odor detection. The adsorption films of different kinds are used for each of the crystal vibrators 111. In FIG. 1, the crystal vibrators 111 are equipped with mutually different kinds of adsorption films. The adsorption films may preferably be formed on the both surfaces of the crystal vibrator 111.

As the adsorption film, a polymer film, a fat film, a protein film, or a single molecule film may be used.

Oscillation Circuit 112

The oscillation circuit 112 is structured to be connected to the crystal vibrator 111. The oscillation circuit 112 is a circuit that outputs an oscillation signal having a frequency defined by Equation 1 described above. A concrete structure of the oscillation circuit 112 will be described later.

Counter Circuit 120

The counter circuit 120 specifies a relation between the oscillation signal inputted from the oscillation circuit 112 and a gate clock inputted from the gate clock generation circuit 130, and outputs the specified result as a count value to the data processing circuit 140. More concretely, the counter circuit 120 counts pulses that are specified by rising edges or falling edges of the oscillation signal in each cycle of the gate clock (hereafter referred to as a gate time).

Gate Clock Generation Circuit 130

The gate clock generation circuit 130 is structured to supply the gate clock to the counter circuit 120. More specifically, the gate clock generation circuit 130 has a function to generate a gate clock having a predetermined frequency, and transmits the signal to each of the counter circuits 120. The gate clock is a signal that has a frequency lower than that of the oscillation signal. In other words, the signal cycle of the gate clock is longer than that of the oscillation signal. Specifically, it is empirically known that the signal cycle of the gate clock may preferably be 0.01 µsec. or greater but less than 1 sec.

Data Processing Circuit 140

The data processing circuit 140 is structured to specify, based on the count values outputted from the plurality of counter circuits 120, one or both of whether or not the respective crystal vibrators 111 adsorb target substance, and the amount of the target substance adsorbed. More specifically, based on the count value outputted from each of the counter circuits 120, the data processing circuit 140 specifies a frequency of the oscillation signal generated by the corresponding crystal vibrator 111 and the oscillation circuit 112. Further, the data processing circuit 140 observes a change in the frequency of the oscillation signal with time. Then, the data processing circuit 140, based on the change in the frequency of the oscillation signal, can specify as to whether or not each of the crystal vibrators 111 adsorbs substance, and as to the quantity of the substance if adsorbed, with reference to the database 150.

Database 150

The database 150 stores information necessary for specifying odors, and is structured to transmit the information in response to a request from the data processing circuit 140. Here, the information necessary for specifying odors may be, for example, a table showing relationships between frequency variations in the oscillation signal in each of the crystal vibrators 111 and the adsorption amounts of target substance to be adsorbed on each of the crystal vibrators 111.

Operation as Odor Sensor

First, the plurality of crystal vibrators 111 are oscillated in reference air (preferably odorless air treated by activated charcoal or the like), and the frequency of an oscillation signal outputted from each of the oscillation circuits 112 connected to the crystal vibrators 111, respectively, is measured.

Next, the plural crystal vibrators 111 are exposed to a gas that is a target substance. If the gas can be smelled, the gas contains odor molecules that compose the odor, and the odor molecules are adsorbed to the adsorption films formed on the surface of the crystal vibrators 111. The odor molecules have a mass, and the crystal vibrator 111 having the adsorption films that have adsorbed the odor molecules has an increase in load corresponding to the mass of the odor molecules adsorbed. The increase in the load is observed as a reduction in the frequency of the oscillation frequency. In other words, the amount of the odor molecules adsorbed can be obtained by specifying the reduction in the frequency of the oscillation signal by the counter circuit 120 and the data processing circuit 140.

On the other hand, the database 150 stores relationships between changes in the frequency of the oscillation signal and adsorption quantities of odor molecules, and relationships between the adsorption quantities of odor molecules and odors, which have been formed in advance into a database. The data processing circuit 140 refers to the database 150, whereby, if matching data exists on the database 150, it is possible to specify that gas as a target substance has known odor.

2. Example Structure of Oscillation Circuit Connected to Vibrator

Figure 2:
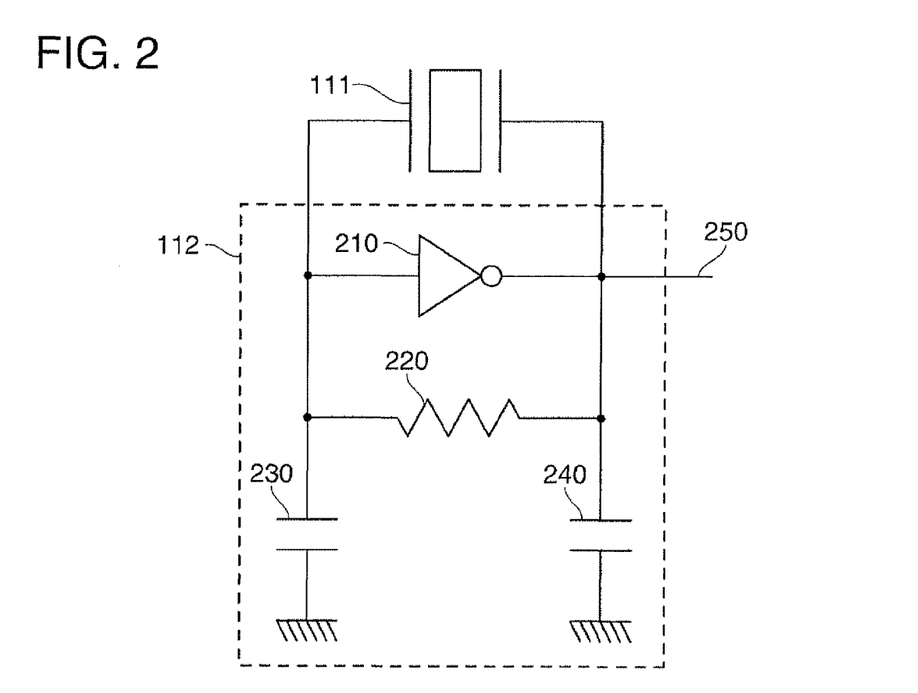
FIG. 2 is a diagram showing an example of the structure of an oscillation circuit connected to a vibrator.

FIG. 2 is a diagram showing an example of the structure of the oscillation circuit 112 connected to the vibrator 111. As shown in FIG. 2, the oscillation circuit 112 includes an inverter 210, a feedback resistance 220, added capacitances 230 and 240, and an oscillation signal output terminal 250. Moreover, the oscillation circuit 112 is connected to the crystal vibrator 111. A combination of the crystal vibrator 111 and the oscillation circuit 112 forms a so-called Colpitts oscillation circuit. The first excitation electrode of the crystal vibrator 111 is connected to an input of the inverter 210, a first terminal of the feedback resistance 220 and a first terminal of the added capacitance 230. The second excitation electrode of the crystal vibrator 111 is connected to an output of the inverter 210, a second terminal of the feedback resistance 220, a first terminal of the added capacitance 240, and the oscillation signal output terminal 250. Also, a second terminal of the added capacitance 230 and a second terminal of the added capacitance 240 are both grounded. It is noted that the terminals of the crystal vibrator 111 and the feedback resistance 220 do not have polarities, such that their terminals may be inverted without affecting the operation at all.

It is noted that the Colpitts oscillation circuit is only an example, and the oscillation circuit 112 may be composed with any one of other structures.

3. Example of Structure of Vibrator

Next, the structure of the crystal vibrator (a crystal vibration plate) in the oscillator array in accordance with the present embodiment will be described in greater detail.

Figure 3:
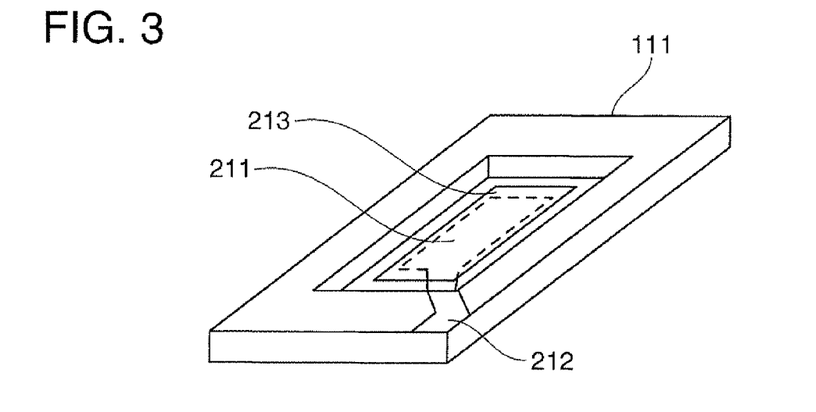
FIG. 3 is a view showing a structure example of a front surface of a vibrator in accordance with an embodiment of the invention.
Figure 4:
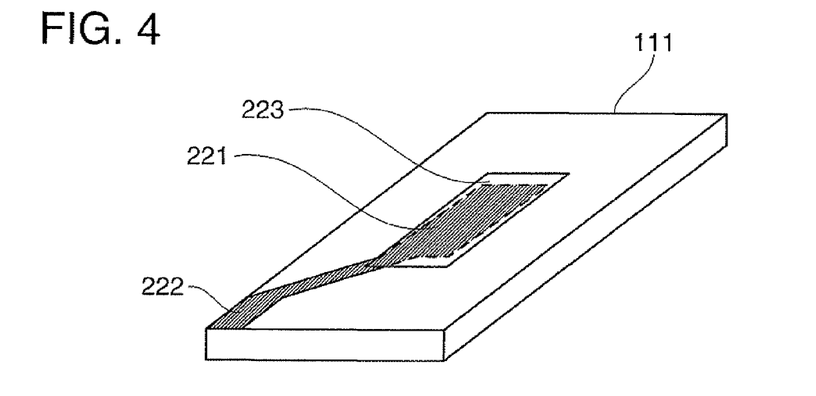
FIG. 4 is a view showing a structure example of a back surface of the vibrator in accordance with an embodiment of the invention.

FIG. 3 is a view showing the structure example of a front surface of the crystal vibrator in accordance with the embodiment, and FIG. 4 is a view showing the structure example of a back surface of the vibrator in accordance with the present embodiment. As shown in FIG. 3, the crystal vibrator 111 is a so-called inverted mesa type vibrator having a recess in its front surface, and is equipped on its front surface with an excitation electrode 211 and a lead-out electrode 212. Further, an adsorption film 213 having a characteristic that selectively adsorbs specific substance is formed in a manner to cover the excitation electrode 211. Also, as shown in FIG. 4, the back surface does not have a recess formed therein. The back surface is equipped with an excitation electrode 221 and a lead-out electrode 222, and an adsorption film 223 is formed in a manner to cover the excitation electrode 221. The adsorption film 223 may preferably have a characteristic of adsorbing the same substance as the adsorption film 213 formed on the front surface does, but is not limited to this. The excitation electrodes 211 and 221 are formed in regions including the central sections of the front surface and the back surface, respectively. The crystal vibrator 111 is an AT-cut quartz vibrator, and operates in a so-called thickness shear vibration mode when a voltage is applied across the excitation electrodes formed on the front and back surfaces of the quartz plate. In the thickness shear vibration mode, crystal lattices of quartz composing the vibrator are strained in a thickness direction, and the front surface and the back surface of the vibrator are displaced in mutually opposite directions, thereby causing vibrations with a predetermined frequency. Hereunder, the excitation electrodes 211 and 221 formed on the front surface and the back surface of the crystal vibrator 111 are called a "pair of excitation electrodes" and the lead-out electrodes 212 and 222 are called a "pair of lead-out electrodes."

The pair of excitation electrodes 211 and 221 is formed in the recessed section of the crystal vibrator 111 in a manner to interpose the crystal vibrator 111. As described above, by applying a voltage to the pair of excitation electrodes 211 and 221, the crystal vibrator 111 starts vibration.

The pair of lead-out electrodes 212 and 222 is formed in a manner to contact with at least one end of the crystal vibrator 111. The pair of lead-out electrodes 212 and 222 may preferably be formed in a manner that they do not overlap each other on the front surface and the back surface of the crystal vibrator 111 in a thickness direction of the crystal vibrator 111. This is to avoid cross-talk which may be generated between the pair of lead-out electrodes, if the lead-out electrodes 212 and 222 overlap each other in the thickness direction of the crystal vibrator 111.

4. Example of Arrangement of Vibrators on Substrate

The invention relates to oscillators and oscillator arrays that are used for the sensor system described above, and largely characterized by placements of the vibrators on the substrate. Concrete structures of the oscillator array will be described, referring to examples.

(1) Embodiment 1

Figure 5:
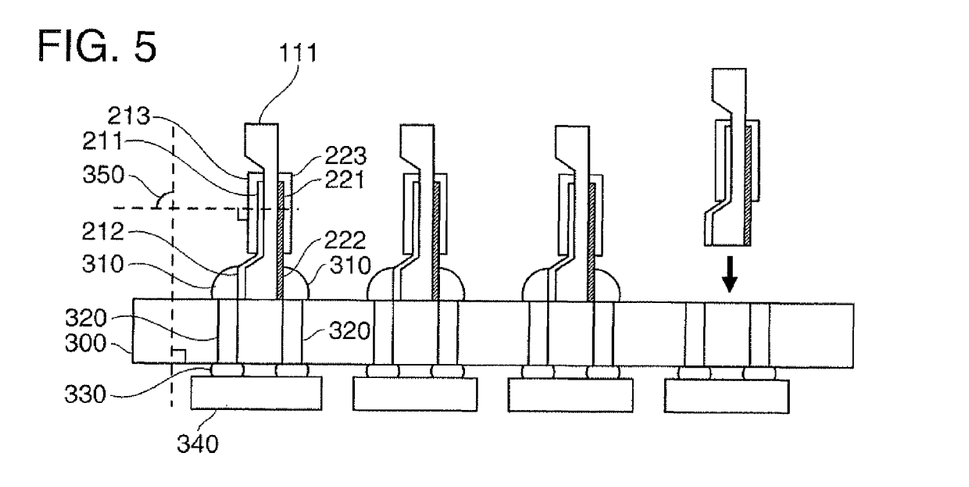
FIG. 5 is a schematic side view showing a first placement example of vibrators on a substrate.

FIG. 5 is a schematic side view showing a first placement example of vibrators on a substrate in accordance with an embodiment 1. As shown in FIG. 5, a substrate 300 is structured to have a plurality of crystal vibrators 111 erected thereon. The substrate 300 is structured with a first connection section 310, a pass-through wiring 320 and a second connection section 330. Further, an integrated circuit 340 is arranged in the back surface of the substrate 300.

The pair of excitation electrodes 211 and 221 of the crystal vibrator 111 is connected to the pass-through wiring 320 in the substrate 300 via the pair of lead-out electrodes 212 and 222, respectively, and the first connection section 310. The first connection section 310 is arranged on the front surface of the substrate 300, and connects the crystal vibrator 111 with the pass-through wiring 320 in the substrate 300 in a manner described above. The pass-through wiring 320 penetrates the substrate 300, and is formed to connect the crystal vibrator 111 with the integrated circuit 340 arranged on the back surface of the substrate 300. The pass-through wiring 320 is connected to the integrated circuit 340 via the second connection section 330 arranged on the back surface of the substrate 300. The integrated circuit 340 is structured with the oscillation circuit 112 included therein. It is noted that the first connection section 310 and the second connection section 330 may be composed of conductive paste such as silver paste.

In this manner, a plurality of crystal vibrators 111 are erected on the substrate 300, and the plural crystal vibrators 111 are connected to the integrated circuits 340 via the first connection sections 310, the pass-through wirings 320 and the second connection sections 330 included in the substrate 300, respectively.

Also, each of the crystal vibrators 111 is erected on the substrate 300 such that the normal direction to the crystal vibrator 111 and the normal direction to a primary surface of the substrate 300 have a predetermined angle 350. In the embodiment 1, the predetermined angle 350 is the right angle.

As described above, the oscillator of the embodiment 1 is equipped with the crystal vibrators 111 that vibrate in a thickness shear vibration mode, the first adsorption film 213 formed in a first region in a first surface (for example, the front surface) of each of the crystal vibrators 111, the second adsorption film 223 formed in a second region in a second surface (for example, the back surface) of each of the crystal vibrators 111 opposite to the first surface, and the substrate 300 provided on its front surface with the crystal vibrators 111 erected thereon, wherein each of the crystal vibrators 111 is in contact with the substrate 300 in a third surface (for example, the placement surface) different from the first surface or the second surface.

According to such a structure, as the crystal vibrators 111 are erected on the substrate 300, the adsorption films 213 and 223 formed on both surfaces of each of the crystal vibrators 111 can be readily brought in contact with target substance, whereby the mass of adsorbed substance ΔM can be increased. By this, the sensitivity in detecting target substance by the crystal vibrators 111 can be enhanced.

Furthermore, by erecting and fixing the crystal vibrator 111 on the substrate 300 in a manner that only one side of the crystal vibrator contacts the substrate 330, changes in the oscillation frequency that may be caused by stress resulting from warping of the substrate 300 and influencing the crystal vibrator 111 can be suppressed to a minimum.

Also, the crystal vibrator 111 of the oscillator in accordance with the embodiment 1 may preferably have an inverted mesa type structure having a recess formed in either the front surface or the back surface.

According to such a structure, even when the crystal vibrator 111 having a so-called inverted mesa structure having a recess in only one of the surfaces of the crystal vibrator 111 is used, target substance would readily be brought in contact with the both surfaces of the crystal vibrator 111, such that the mass of adsorbed substance ΔM can be increased.

It can also be said that the oscillator array in accordance with the embodiment 1 is equipped with a plurality of crystal vibrators 111 each having a recess in at least one surface thereof, and the substrate 300 having the plural crystal vibrators 111 separately erected thereon.

Also, it is preferred that the excitation electrode 211 formed between the crystal vibrator 111 and the first adsorption film 213 in the first region, and the excitation electrode 221 formed between the crystal vibrator 111 and the second adsorption film 223 in the second region may further be provided.

According to this structure, the excitation electrodes 211 and 221 are provided between the crystal vibrator 111 and the adsorption films 213 and 223, respectively, in the regions where the adsorption films 213 and 223 are formed, whereby the crystal vibrator 111 can be uniformly vibrated.

It is more preferred that the first and second regions of the crystal vibrator 111 may be arranged to include the central portions in the first surface and the second surface, respectively, as this can vibrate the crystal vibrator 111 more uniformly.

It is also preferred to have an excitation electrode formed in a third region, in the first surface, that contacts the substrate 300 but does not overlap the first region, and an excitation electrode formed in a fourth region, in the second surface, that contacts the substrate 300 but does not overlap the second region.

Also, an oscillator array may preferably be equipped with a plurality of any of the vibrators described above. According to the oscillator array having such a structure, the oscillator array that requires a plurality of oscillators can be formed, while making the best use of the characteristic of any one of the oscillators described above. Therefore it is possible to provide an oscillator array having an improved higher detection sensitivity of target substance. It is also possible to form an oscillator array equipped with a plurality of oscillators to be described below.

Also, in the oscillator or the oscillator array in accordance with the embodiment 1, the crystal vibrator 111 may preferably have the pair of excitation electrodes 211 and 221 respectively formed on the both surfaces of the crystal vibrator 111, and the pair of lead-out electrodes 212 and 222 respectively formed on the both surfaces of the crystal vibrator 111 and respectively connected to the pair of excitation electrodes 211 and 221, and the crystal vibrator 111 may preferably be connected to the substrate 300 via the pair of lead-out electrodes 212 and 222.

If mounting crystal vibrators on a plane surface of a substrate, like in the related art, a certain contrivance was necessary when connecting a pair of excitation electrodes formed on both surfaces of the crystal vibrator to the substrate, such as, routing the wirings around. According to the structure in accordance with the embodiment 1, the crystal vibrators 111 are erected, and the substrate 300 and the crystal vibrators 111 are connected to one another via the lead-out electrode pairs 212 and 222. By this, the excitation electrode pairs 211 and 221 formed on the both surfaces of the crystal vibrators 111 can be readily connected to the substrate 300. Further, compared to the related art, the distance between the crystal vibrators 111 and the substrate 300 can be shortened. Accordingly, conductive paste such as silver paste or the like may be used for such connections, whereby the manufacturing is facilitated.

Also, the integrated circuit 340 including the oscillation circuit may preferably be further provided on the back surface of the substrate 300, and the pair of excitation electrodes 211 and 221 may preferably be connected to the integrated circuit 340, respectively, through the pass-through wirings 320 that penetrate the substrate 300.

According to the structure in accordance with the embodiment 1, the wirings between the crystal vibrators 111 and the oscillation circuits 112 can be shortened, whereby noise that may enter the wirings can be reduced.

In the example according to the embodiment 1 described above, the predetermined angle 350 between the normal direction to the crystal vibrator 111 and the normal direction to a primary surface of the substrate 300 is the right angle. However, the angle 350 may not necessarily be required to be the right angle. However, the angle 350 may preferably be 60 degrees or more but less than 120 degrees. In this case, target substance would readily be brought in contact with the both surfaces of the crystal vibrator 111.

Also, the first connection section 310 and the second connection section 330 are composed of conductive paste such as silver paste. This facilitates the manufacturing, compared to a case where the wirings are made of wires. It is more preferable to form the first connection section 310 and the second connection section 330 with silver paste. In this case, the electrical resistance of the connection sections can be reduced, and their handling can be facilitated.

Furthermore, the conductive paste composing the first connection section 310 and the second connection section 330 may preferably be reinforced with resin or the like.

However, the first connection section 310 and the second connection section 330 may not necessarily be composed of conductive paste. Even in this case, the detection sensitivity in detecting target substance by the crystal vibrators 111 can be increased.

The features of the embodiment 1 are commonly applicable to embodiments described below in a mutually consistent range.

(2) Embodiment 2

Figure 6:
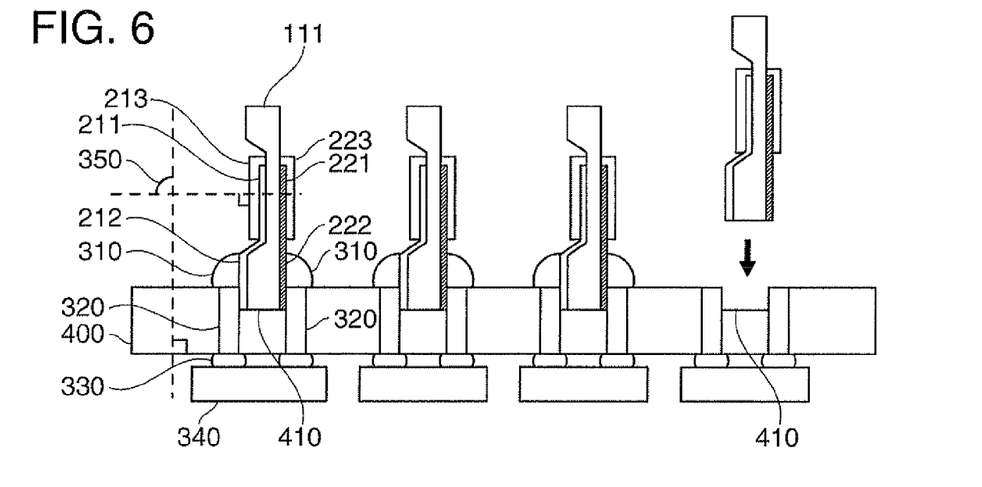
FIG. 6 is a schematic side view showing a second placement example of vibrators on a substrate.

FIG. 6 is a schematic side view showing a second placement example of the vibrators on a substrate in accordance with en embodiment 2. The embodiment 2 is substantially the same as the embodiment 1 in many aspects, and therefore only differences thereof will be described. As to the aspects that are not described concretely, the embodiment 2 and the embodiment 1 have the same structure and function.

As shown in FIG. 6, a substrate 400 is provided with grooves 410. One ends of the crystal vibrators 111 are fitted in the grooves 410 so as to be erected on the substrate. Also, a flat portion at one end of the crystal vibrator 111 on the side it is fitted in the groove 410 is made longer than a flat portion on the other end on the opposite side thereof. It is noted that the flat portion is a portion in the crystal vibrator 111 where the recess is not formed in the surface thereof. Also, the pair of lead-out electrode 213 and 222 are formed at one end of the crystal vibrator 111 on the side fitted in the groove 410.

As described above, in addition to the structure of the embodiment 1, the oscillator in accordance with the embodiment 2 is further characterized in that the crystal vibrators 111 are fitted in the grooves 410 provided in the substrate.

According to the characteristic described above, the mounting strength of the crystal vibrators 111 erected on the substrate 400 can be enhanced. By this, the danger of the crystal vibrators 111 being separated from the substrate 400 or the crystal vibrators 111 being destroyed can be reduced even when vibration or impact is applied. Also, sufficient mounting strength can be obtained even with a smaller amount of conductive paste used for the first connection section 310 and the second connection section 330, such that the manufacturing cost can be lowered.

Also, it can also be said that the oscillator array in accordance with the embodiment 2 is further characterized in that the substrate 400 has the grooves 410, and the crystal vibrators 111 are erected in a manner that one ends of the crystal vibrators 111 are fitted in the grooves 410.

Moreover, the oscillator array in accordance with the embodiment 2 is further characterized in that the flat potion of the crystal vibrator 111 at one end thereof is longer than the flat portion of the crystal vibrator 111 on the other end opposite to the one end.

According to the characteristic described above, as one end of the crystal vibrator 111 on the side thereof which is fitted in the groove 410 provided in the substrate 400 is made longer than the other end thereof, the mounting strength of the crystal vibrator 111 erected on the substrate 400 can be further enhanced. Also, the crystal vibrators 111 can be more readily attached to the substrate 400.

In accordance with the embodiment 2 described above, the example is equipped with the first connection sections 310. However, the first connection sections 310 may not necessarily be required. In other words, the pass-through wirings 320 may be structured to be exposed in the grooves 410, and the lead-out electrode pair 211 and 221 may be structured to be connected to corresponding ones of the pass-through wirings 320, respectively, when the crystal vibrator 111 is fitted in the groove 410.

(3) Embodiment 3

Figure 7:
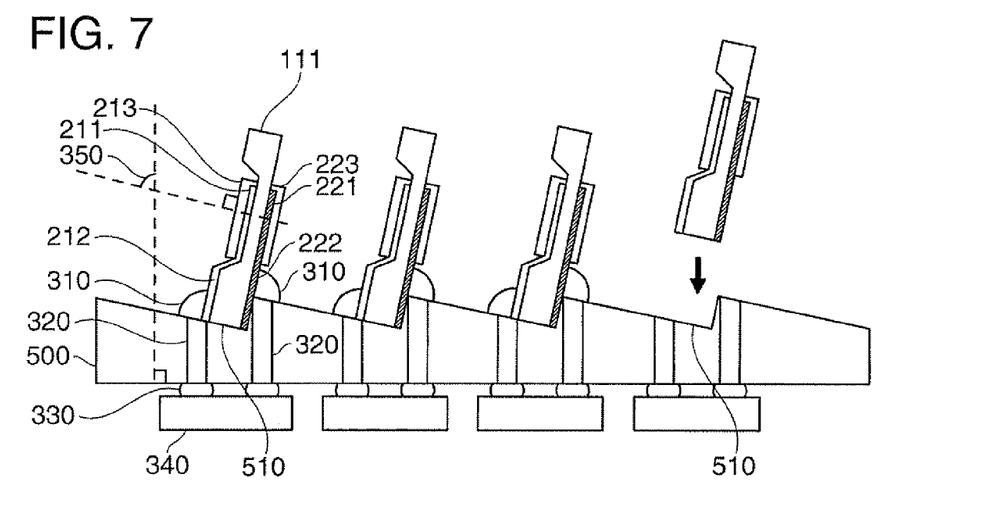
FIG. 7 is a schematic side view showing a third placement example of vibrators on a substrate.

FIG. 7 is a schematic side view showing a third placement example of the vibrators on a substrate in accordance with an embodiment 3. The embodiment 3 is substantially the same as the embodiment 1 in many aspects, and therefore only differences thereof will be described. As to features that are not described concretely below, the embodiment 3 and the embodiment 1 may have the same structure and function.

As shown in FIG. 7, a substrate 500 is structured to have inclined surfaces 510 at least in portions where plural crystal vibrators 111 are erected. The plural crystal vibrators 111 are erected on the inclined surfaces 510, and therefore are arranged on the substrate 500 with a predetermined inclination. In other words, the plural crystal vibrators 111 are erected on the substrate 500 such that the angle 350 between the normal direction to each of the crystal vibrators 111 and the normal direction to a primary surface of the substrate 500 has a predetermined angle. Here, the predetermined angle 350 may preferably be 60 degrees or more but 120 degrees or less.

Also, the substrate 500 has an inclined staircase structure, and step surfaces of the staircase structure are formed to be generally perpendicular to the inclined surfaces 510 that are erecting surfaces for erecting the crystal vibrators 111. According to such a structure of the substrate 500, the crystal vibrators 111 can be erected in a manner that corner sections thereof are fitted into corner sections defined between the step surfaces of the staircase structure and the inclined surfaces 510 that are erection surfaces. In this case, the lead-out electrodes 221 on the back surfaces of the crystal vibrators 111 can be connected to the pass-through wirings 320 in the substrate 500 in portions of the crystal vibrators 111 closer to the recesses than in portions thereof connecting to the inclined surfaces 510. Accordingly, the lead-out electrodes 221 on the back surfaces of the crystal vibrators 111 in accordance with the embodiment 3 are not required to be extended to portions where the crystal vibrators 111 contact the inclined surfaces 510, and may only require to be extended to portions where the lead-out electrodes 221 can be connected to the pass-through wirings 320, as described above.

Also, the pass-through wirings 320 in the substrate 500 may be formed in a manner to be exposed in the step surfaces. In this case, the lead-out electrodes 221 on the back surfaces of the crystal vibrators 111 can be connected to the pass-through wirings 320 without using the first connection sections 310.

As described above, in addition to the structure of the embodiment 1, the oscillator in accordance with the embodiment 3 is further characterized in that the crystal vibrators 111 are erected on the inclined surfaces 510 provided on the substrate 500.

According to the characteristic described above, the crystal vibrators 111 can be erected in a manner to have a tilt angle with respect to the substrate 500. Also, the inclined surfaces 510 are formed without forming the grooves 410 in the substrate 500, such that the substrate 500 with enhanced mounting strength to mount the crystal vibrators 111 and the oscillator including the substrate 500 can be more readily manufactured, rather than manufacturing those with the grooves 410 formed therein.

Furthermore, in addition to the characteristics described above, the embodiment 3 is further characterized in that the plural crystal vibrators 111 in the oscillator array are erected on the substrate 500 in a manner that the normal direction to the crystal vibrators 111 and the normal direction to the primary surface of the substrate 500 define the angle 350 that is 60 degrees or more but less than 120 degrees.

If the crystal vibrators 111 are erected with an excessively acute angle with respect to substrate 500, target substance to be adsorbed such as gas may stay adjacent to the crystal vibrators 111. This condition creates a state in which the target substance in contact with the crystal vibrators 111 is difficult to be refreshed, whereby the crystal vibrators 111 may not be able to appropriately adsorb desired target substance.

According to the structure of the embodiment 3, target substance such as gas can be prevented from staying near the crystal vibrators 111, and the crystal vibrators 111 can appropriately adsorb desired target substance. Also, target substance generally uniformly contacts the both surfaces of each of the crystal vibrators 111 on which the adsorption films are formed, whereby the adsorption films can effectively adsorb the target substance.

Moreover, the crystal vibrators 111 may more preferably be erected on the substrate in a manner that the normal direction to the crystal vibrators 111 and the normal direction to the primary surface of the substrate define an angle that is 80 degrees or more but 100 degrees or less.

5. Example of Arrangement of Vibrators

Next, arrangement examples of plural vibrators in accordance with an embodiment of the invention will be described, referring to concrete examples. Figures to be described below are figures of oscillator arrays viewed from above the substrate.

(1) Embodiment 4

Figure 8:
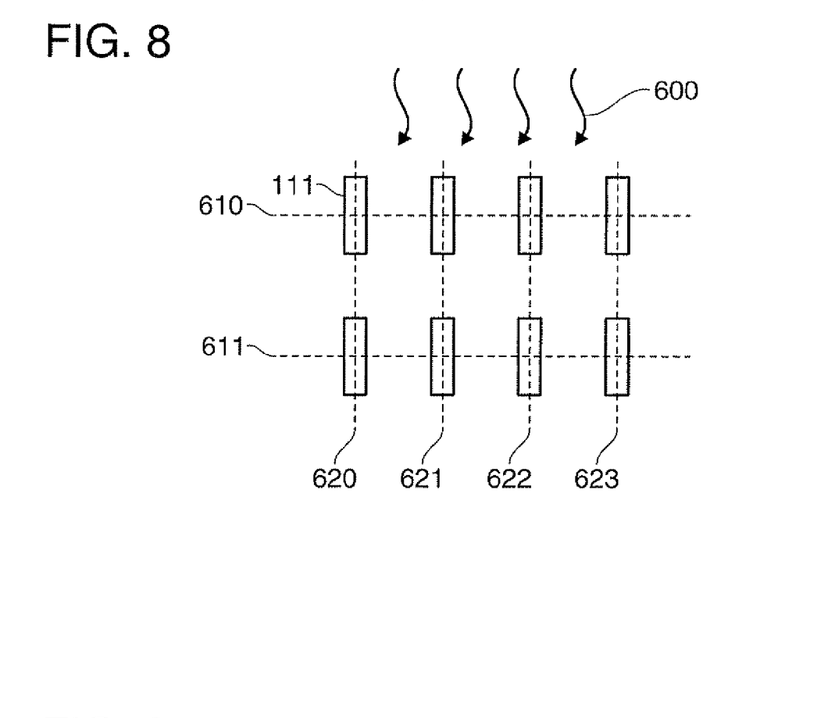
FIG. 8 is a plan view of a first arrangement example of vibrators on a substrate as viewed from above the substrate.

FIG. 8 is a plan view of a first arrangement example of vibrators on a substrate as viewed from above the substrate in accordance with the embodiment 4. As shown in FIG. 8, a plurality of crystal vibrators 111 are arranged and erected on the substrate. FIG. 8 shows top surfaces of the crystal vibrators 111 that are erected perpendicular to the substrate. In FIG. 8, medium such as gas and liquid that is target substance to be adsorbed to the crystal vibrators 111 flows in a direction indicated by a flow direction 600. Further, the crystal vibrators 111 are regularly arranged such that centers thereof are located at intersections between a row 610 and a second row 611 and first through fourth columns 620 through 623. In other words, the plural crystal vibrators 111 are arranged to extend in a first direction (the direction of rows) and in a second direction (the direction of columns) perpendicular to the first direction.

By arranging the crystal vibrators 111 according to the embodiment 4, the plural crystal vibrators 111 are arranged in a matrix configuration in a plan view, and the target substance would readily flow adjacent to the crystal vibrators 111, whereby refreshed target substance is always supplied to the crystal vibrators 111.

(2) Embodiment 5

Figure 9:
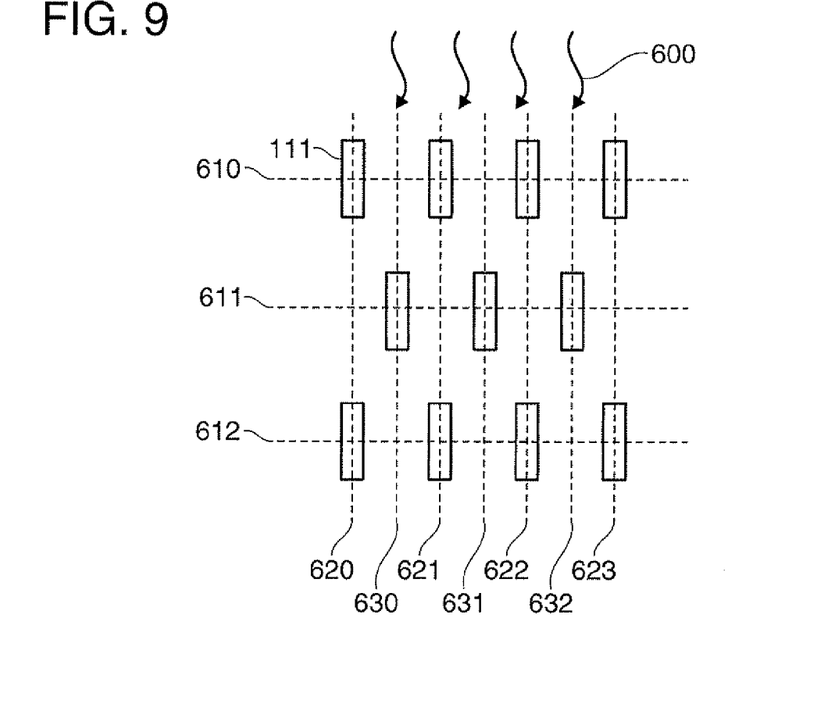
FIG. 9 is a plan view of a second arrangement example of vibrators on a substrate as viewed from above the substrate.

FIG. 9 is a plan view of a second arrangement example of vibrators on a substrate in accordance with an embodiment 5 as viewed from above the substrate. The embodiment 5 is similar to the embodiment 4, and only differences thereof will be described. Features of the embodiment 5 that are not concretely described below have the same structure and function as those of the embodiment 4.

As shown in FIG. 9, the crystal vibrators 111 are arranged on linear lines of first through third rows 610 through 612 on the substrate. Further, the crystal vibrators 111 in odd numbered rows are regularly arranged such that centers of the crystal vibrators 111 are located at intersections between first through fourth columns 620 through 623 and the odd numbered rows (the first row and the third row in the FIGS. 610 and 612. Also, the crystal vibrators 111 in even numbered rows are regularly arranged such that centers of the crystal vibrators 111 are located at intersections between fifth through seventh columns 630 through 632 drawn at equal intervals between the first through fourth columns 620 through 623, and the even numbered row (the second row in the FIG. 611.

FIG. 9 shows an example in which the rows are grouped into odd numbered rows and even numbered rows, and the crystal vibrators 111 are arranged such that the centers thereof in each of the groups are located on each of the rows. However, they are not necessarily required to be grouped into odd numbered groups and even numbered groups. In other words, it is sufficient if the crystal vibrators 111 in the rows arranged in adjacent ones of the columns are shifted from one another.

Stated otherwise, according to the arrangement described above, it can be said that the multiple crystal vibrators 111 are arranged to extend on the substrate such that manners of their alignments in a first direction (the direction of rows) exist in plurality with respect to a second direction (the direction of columns) perpendicular to the first direction, and the alignments in adjacent ones of the rows are shifted from each other.

According to the structure of the embodiment 5, the plural crystal vibrators 111 arranged in a matrix configuration in a plan view are shifted at each of the columns, such that target substance would readily flow in areas adjacent to the crystal vibrators 111, and the crystal vibrators 111 are arranged in a manner that target substance would readily contact the crystal vibrators 111. By arranging the crystal vibrators 111 in this manner, target substance that is in contact with each of the crystal vibrators 111 is always refreshed, and the amount of target substance adsorbed by the crystal vibrators 111 increases. Accordingly, the crystal vibrators 111 would more likely adsorb target substance, and the detection sensitivity of the crystal vibrators 111 can be increased.

(3) Embodiment 6

Figure 10:
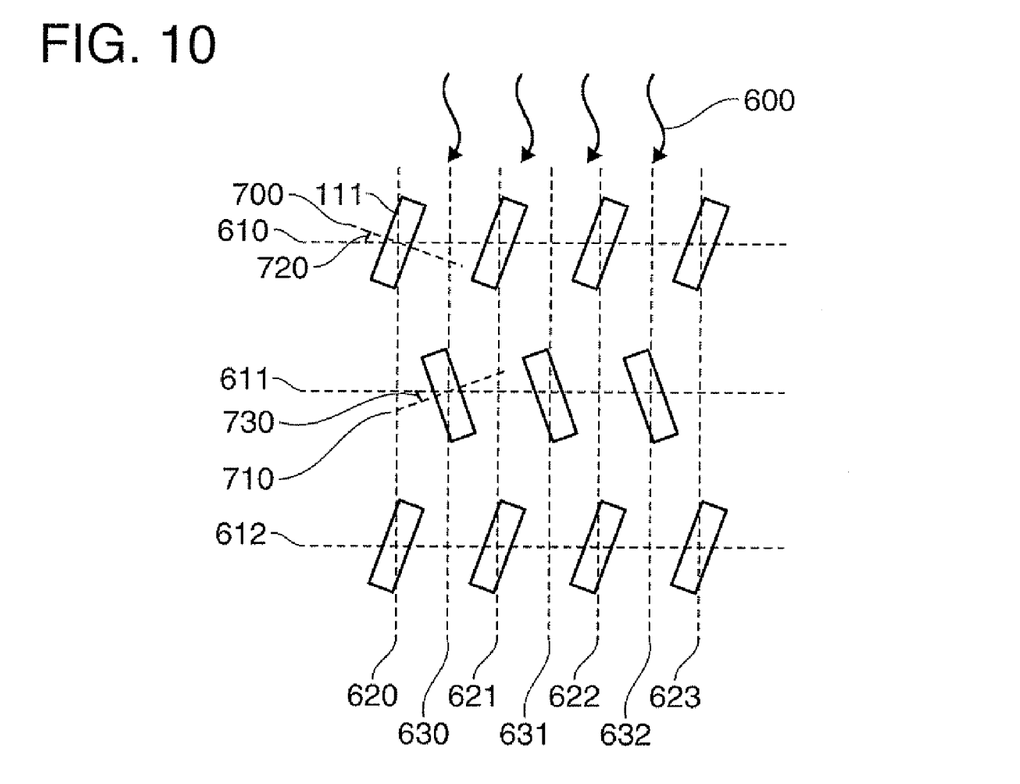
FIG. 10 is a plan view of a third arrangement example of vibrators on a substrate as viewed from above the substrate.

FIG. 10 is a plan view of a third arrangement example of vibrators on a substrate as viewed from above the substrate in accordance with an embodiment 6. The embodiment 6 is similar to the embodiment 5, and therefore only differences thereof will be described. Features of the embodiment 6 that are not concretely described below have the same structure and function as those of the embodiment 5 and the embodiment 4.

As shown in FIG. 10, the crystal vibrators 111 are arranged such that their centers are located in a similar manner as the embodiment 5. More specifically, the multiple crystal vibrators 111 are arranged to extend on the substrate such that manners of their alignments in a first direction (the direction of rows) exist in plurality with respect to a second direction (the direction of columns) perpendicular to the first direction, and the alignments in adjacent ones of the rows are shifted from each other. In addition, in accordance with the embodiment 6, the crystal vibrators 111 in adjacent ones of the columns are arranged such that the normal directions 700 and 710 to the crystal vibrators 111 are different from one another. More concretely, the normal direction 700 to the crystal vibrators 111 arranged in an odd numbered row (e.g., the first row in the FIG. 610 has a first angle 720 with respect to the linear line in the direction of the row 610. On the other hand, the normal direction 710 to the crystal vibrators 111 arranged in an even numbered row (e.g., the second row in the FIG. 611 has a second angle 730 with respect to the linear line in the direction of the row 611.

Stated otherwise, according to the arrangement described above, it can be said that the multiple crystal vibrators 111 are arranged to extend on the substrate such that manners of their alignments in a first direction (the direction of rows) exist in plurality with respect to a second direction (the direction of columns) perpendicular to the first direction, and the normal directions 700 and 710 to the crystal vibrators 111 in adjacent ones of the rows are different from each other.

According to the structure of the embodiment 6, the plural crystal vibrators 111 disposed in a matrix configuration in a plan view are arranged in mutually different orientations, such that turbulence can be generated in target substance flowing through the crystal vibrators 111, and target substance would readily contact the crystal vibrators 111. Accordingly, the detection sensitivity of the crystal vibrators 111 can be further increased.

It is noted that the first angle 720 of the normal direction 700 to the crystal vibrator 111 with respect to the linear line of the orientation of the row 610, and the second angle 730 of the normal direction 710 with respect to the linear line of the orientation of the row 611 may preferably be 45 degrees or less. By setting these angles at 45 degrees or less, it is possible to make the best use of the characteristics of the embodiment 6, without disturbing the flow of target substance that the crystal vibrators 111 adsorb.

6. Conclusion

Some embodiments of the invention have been described above.

The invention further includes a variety of electronic apparatuses using the oscillator or the oscillator array described above.

Figure 11:
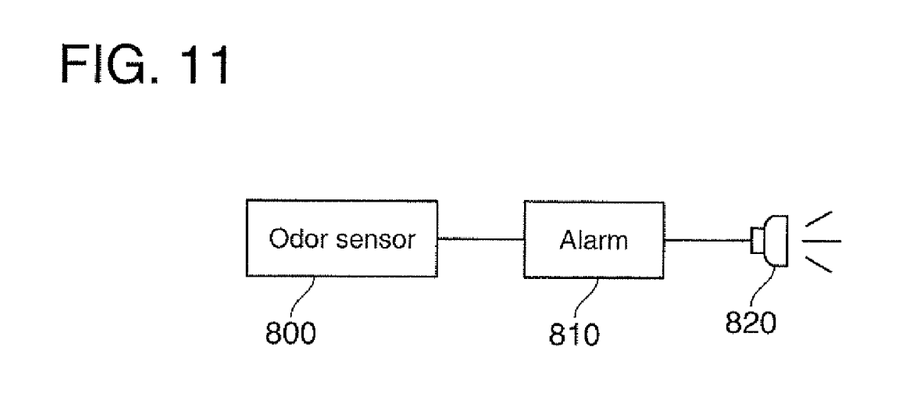
FIG. 11 is a diagram showing a composition example of a gas sensor alarm using an oscillator array.

FIG. 11 is a diagram showing a composition example of a gas sensor alarm using an oscillator array, as an example of the electronic apparatus. In FIG. 11, the gas sensor alarm includes an odor sensor 800, an alarm 810 and a speaker 820.

The odor sensor 800 is a sensor system including the oscillator array shown in FIG. 1, and crystal vibrators included in the oscillator array are equipped with adsorption films for adsorbing odor components of gas of detection target. When the odor sensor 800 detects that the odor components of the gas of detection target are in a predetermined amount or more, the odor sensor 800 instructs the alarm 810 to issue an alarm. In response to the instruction from the odor sensor 800, the alarm 810 transmits a sound signal to the speaker 820 for sounding an alarm. The speaker 820 sounds an alarm based on the sound signal from the alarm 810. It is noted that the alarm 810 and the speaker 820 may use those of related art.

The electronic apparatus with such a structure has the characteristics of the invention described above, and therefore can improve, for example, the detection sensitivity of the vibrators.

The invention is not limited to the embodiments described above, and various combinations of the embodiments and modifications thereto are possible. For example, the invention includes an arrangement in which the substrate having the crystal vibrators 111 erected thereon is equipped with sloped surfaces like the one shown in FIG. 7, and the plural crystal vibrators 111 are arranged in a manner shown in FIG. 9.

Industrial Applicability

The oscillator and the oscillator array in accordance with the invention are applicable to, for example, sensor systems, and applicable to a wide range of equipments, such as, odor sensors, alcohol sensors, narcotic sensors and the like.

What is claimed is:

1. An oscillator comprising:
   a vibrator that vibrates in a thickness shear vibration mode;
   a first adsorption film formed in a first region on a first surface of the vibrator;
   a second adsorption film formed in a second region on a second surface of the vibrator opposing to the first surface; and
   a substrate with a surface on which the vibrator is erected, wherein a third surface of the vibrator that is different from the first surface and the second surface contacts the substrate.

2. An oscillator according to claim 1, wherein the vibrator is equipped with a first electrode formed in the first region between the vibrator and the first adsorption film and a second electrode formed in the second region between the vibrator and the second adsorption film.

3. An oscillator according to claim 1, wherein the vibrator is equipped with a first electrode formed in the first surface in a third region that contacts the substrate and does not overlap the first region and a second electrode formed in the second surface in a fourth region that contacts the substrate and does not overlap the second region.

4. An oscillator according to claim 2, wherein the vibrator is further equipped with an integrated circuit including an oscillation circuit mounted on a back surface of the substrate, wherein the first electrode and the second electrode are connected to the integrated circuit respectively through wirings passing through the substrate.

5. An oscillator according to claim 1, wherein the vibrator is fitted in a groove provided in the substrate.

6. An oscillator according to claim 1, wherein the vibrator is erected on a sloped surface provided in the substrate.

7. An oscillator according to claim 1, wherein the vibrator has an inverted mesa structure having a recess in one of the surfaces.

8. An oscillator array comprising a plurality of the vibrators in plurality recited in claim 1.

9. An oscillator array according to claim 8, wherein the plural vibrators are arranged to extend on the substrate such that manners of alignments of the vibrators in a first direction exist in plurality with respect to a second direction perpendicular to the first direction, and normal directions to the vibrators in adjacent ones of the rows are in different orientations.

10. An electronic apparatus comprising the oscillator recited in claim 1.

11. An electronic apparatus comprising the oscillator array recited in claim 8.

* * * * *